(12) United States Patent
Kawakami et al.

(10) Patent No.: US 7,623,213 B2
(45) Date of Patent: Nov. 24, 2009

(54) SWITCHING DEVICE

(75) Inventors: Haruo Kawakami, Kanagawa (JP); Hisato Kato, Tokyo (JP); Keisuke Yamashiro, Kanagawa (JP); Kyoko Kato, Kanagawa (JP)

(73) Assignee: Fuji Electric Holdings Co., Ltd. (JP)

( * ) Notice: Subject to any disclaimer, the term of this patent is extended or adjusted under 35 U.S.C. 154(b) by 343 days.

(21) Appl. No.: 11/444,133

(22) Filed: May 30, 2006

(65) Prior Publication Data
US 2006/0284155 A1 Dec. 21, 2006

Related U.S. Application Data

(63) Continuation of application No. PCT/JP2004/017581, filed on Nov. 26, 2004.

(30) Foreign Application Priority Data

Nov. 28, 2003 (JP) ............... 2003-398360
Jun. 15, 2004 (JP) ............... 2004-176466

(51) Int. Cl.
*C09K 19/02* (2006.01)
*G02F 1/1343* (2006.01)
*H01L 51/00* (2006.01)

(52) U.S. Cl. ............... 349/172; 349/139; 257/40
(58) Field of Classification Search ........ 349/172, 349/139, 167, 171, 196
See application file for complete search history.

(56) References Cited

U.S. PATENT DOCUMENTS 5,308,998 A * 5/1994 Yamazaki et al. ............. 257/57
5,654,784 A * 8/1997 Yasuda et al. ............... 349/172
6,040,884 A * 3/2000 Yasuda et al. ............... 349/129

(Continued)

FOREIGN PATENT DOCUMENTS

JP 2003-105039 A 4/2003

(Continued)

OTHER PUBLICATIONS

Examination Report from the UK Patent Office issued for corresponding Patent Application No. GB0610568.8, dated Nov. 28, 2006.

(Continued)

*Primary Examiner*—Uyen Chau N Le
*Assistant Examiner*—Rhonda S Peace
(74) *Attorney, Agent, or Firm*—Rossi, Kimms & McDowell, LLP

(57) ABSTRACT

A switching device in which an organic bistable material layer containing an organic bistable compound having two types of stable resistance against an applied voltage is provided between at least two electrodes. In the switching device, a first electrode layer, an electric charge injection suppressing layer, an organic bistable material layer and a second electrode layer are sequentially formed on a substrate as respective thin films, in which the electric charge injection suppressing layer contains an electrically conductive layer which allows an electric charge injection amount from the first electrode layer to the organic bistable material layer to be small compared with that in a case in which the electric charge is directly injected from the first electrode layer to the organic bistable material layer without providing the electric charge injection suppressing layer.

12 Claims, 7 Drawing Sheets

U.S. PATENT DOCUMENTS

| | | | |
|---|---|---|---|
| 7,151,029 B2 * | 12/2006 | Bozano et al. | 438/257 |
| 2003/0195359 A1 | 10/2003 | Ohkura et al. | |
| 2003/0219664 A1 | 11/2003 | Ohkura et al. | |
| 2004/0012035 A1 * | 1/2004 | Branz et al. | 257/130 |
| 2004/0033430 A1 * | 2/2004 | Sekine et al. | 430/76 |
| 2004/0108514 A1 | 6/2004 | Tanaka et al. | |

FOREIGN PATENT DOCUMENTS

| | | | |
|---|---|---|---|
| JP | 2003-228185 A | 8/2003 |
| JP | 2003-238561 A | 8/2003 |
| JP | 2003283004 A | 10/2003 |

OTHER PUBLICATIONS

Kumai et al. "Current-Inducing Metallization and Stripe Pattern Formation of K-TCNQ Crystals"; Solid Physics vol. 35, No. 1 (2000) pp. 33-40.

Potember et al.; "Electrical Switching and Memory Phenomena in CU-TCNQ Thin. Films"; American Institute of Physics; Appl. Phys. Lett. 34 (6), (1979) pp. 405-407.

Oyamada et al.; "Switching Effect in CU:TCNQ Charge Transfer-Complex Thin Fims by Vacuum Codeposition"; American Institute of Physics; 0003-6951 (2003) vol. 83(6) pp. 1252-1254.

Relevant Portion of International Search Report of Corresponding PCT Application No. PCT/JP2004/017581.

* cited by examiner

SWITCHING DEVICE

BACKGROUND

The present invention relates to a switching device for driving of a display panel which uses an organic EL, a liquid crystal or the like, or a switching device to be utilized in a high density memory or the like.

In recent years, the characteristics of an organic electronic material have remarkably been improved. Particularly, it has been considered as to whether a so-called organic bistable material in which, when a voltage is continuously applied on the material in an increasing manner, a current in a circuit is abruptly increased at a given voltage or more and a switching phenomenon is observed can be applied to a switching device for driving an organic EL display panel, a high density memory, or the like.

In FIG. 11, an example of voltage-current characteristics of an organic bistable material which shows such switching behavior as described above is shown. As shown in FIG. 11, the organic bistable material has two types of current-voltage characteristics, that is, high resistance characteristics 51 (off state) and low resistance characteristics 52 (on state) and also has non-linear response characteristics such that, in a state in which a bias of Vb is previously applied, when a voltage is allowed to be Vth2 or more, resistance is changed and, then, the off state is converted into the on state, whereas, when a voltage is allowed to be Vth1 or less, resistance is changed and, then, the on state is converted into the off state. Namely, by applying a voltage of Vth2 or more or Vth1 or less on the organic bistable material, a so-called switching behavior can be performed. On this occasion, Vth1 and Vth2 can be applied as a voltage in a pulse state.

As for organic bistable materials showing such non-linear response as described above, various types of organic complexes are known. For example, R. S. Potember et al. Appl. Phys. Lett. 34, (1979) 405 discusses experimentally manufacturing a switching device having two types of stable resistance against a voltage by using a Cu-TCNQ (copper-tetra-cyanoquinodimethane) complex. Further, Kumai et al. Solid Physics 35, (2000) 35 observes a switching behavior by a non-linear response using a monocrystal of K-TCNQ (potassium-tetracyanoquinodimethane) complex. Still further, Oyamada et al. Appl. Phys. Lett. 83, (2003) 1252 discusses forming a Cu-TCNQ complex thin film by using a vacuum evaporation method and, then, while clarifying switching characteristics thereof, possibility of application thereof to an organic EL matrix is studied and, on this occasion, formation of an alumina film between a Cu-TCNQ electric charge transfer complex and an alumina electrode is disclosed (See also, JP-A-2003-283004)

However, a switching device using the electric charge transfer complex has several problems. First of all, since the electric charge transfer complex is constituted of an electron-donating molecule and an electron-accepting molecule at a rate of 1:1 by using a co-deposition method or the like, it has a shortcoming such that it is difficult to control a composition thereof. Further, the switching device using the electric charge transfer complex has not sufficient reproducibility in the switching phenomenon and all devices produced in a same production condition do not necessarily exhibit switching characteristics. Namely, there is a problem such that appearance probability of devices which perform switching (transfer) is low. Further, even when the transfer is noticed, there is a problem such that, particularly, a transfer voltage from the off state to the on state is not constant.

Although a cause of such fluctuation as described above is not yet understood, reasons as described below are considered. Namely, in the above-described switching device, trace amounts of electric charges are injected in an organic layer in the off state. Then, the thus-injected electric charges are accumulated in an organic film or at an interface between the organic film and a metallic electrode and, thereafter, when the thus-accumulated electric charges reach a given threshold value, a transfer to the on state occurs; however, it is considered that, since such injection of the trace amounts of electric charges in the off state as described above is not constant, the fluctuation occurs.

Further, particularly, when the electric charge injection is unduly large, it is considered that there is a case in which the off state can not be maintained and a bistable property itself is not exhibited; on the other hand, when the electric charge injection is unduly small, it is considered that there is a case in which, since the electric charges are not accumulated, the transfer to the on state is not performed and, therefore, the bistable property is not exhibited.

In view of such conventional technical problems as described above, it would be desirable to provide a switching device in which an organic bistable material is disposed between electrodes and, then, appearance probability (transfer probability) of devices which perform switching is enhanced, fluctuation of a transfer voltage is small and switching characteristics are stabilized.

SUMMARY OF THE INVENTION

The switching device according to the present invention is a switching device in which an organic bistable material layer containing an organic bistable compound having two types of stable resistance against an applied voltage is provided between at least two electrodes and is characterized in that a first electrode layer, an electric charge injection suppressing layer, an organic bistable material layer and a second electrode layer are sequentially formed to be respective thin films and, then, the electric charge injection suppressing layer comprises an electrically conductive layer which allows an electric charge injection amount from the first electrode layer to the organic bistable material layer to be small compared with that in a case in which the electric charge is directly injected from the first electrode layer to the organic bistable material layer without providing the electric charge injection suppressing layer.

Another aspect according to the present invention is a switching device in which an organic bistable material layer containing an organic bistable compound having two types of stable resistance against an applied voltage is provided between at least two electrodes and is characterized in that a second electrode layer, an organic bistable material layer, an electric charge injection suppressing layer and a first electrode layer are sequentially formed to be respective thin films and, then, the electric charge injection suppressing layer contains an electrically conductive layer which allows an electric charge injection amount from the first electrode layer to the organic bistable material layer to be small compared with that in a case in which the electric charge is directly injected from the first electrode layer to the organic bistable material layer without providing the electric charge injection suppressing layer.

In the switching device of the present invention, it is preferable that the electric charge injection suppressing layer is an electrically conductive layer which suppresses the electric charge injection amount to one tenth or less.

According to the switching device of the present invention, since the electric charge injection suppressing layer the electrically conductive layer which allows an electric charge injection into the organic bistable material layer at a same voltage to be small is provided between the electrode layer and the organic bistable material layer, the electric charge injection suppressing layer adjusts electric resistance, to thereby suppress the electric charge injection amount at the off state. For this account, not only the transfer probability can be increased but also characteristics such as transfer voltage can be stabilized.

According to the invention, it is preferable that volume resistivity of the electric charge injection suppressing layer is from $10^5$ to $10^7$ ($\Omega$cm).

According to the present invention, it is preferable that the electric charge injection suppressing layer contains a metal oxide. According to such case as described above, since the metal oxide is ordinarily stable in the air and, moreover, by appropriately controlling an amount of the oxide, the electric charge injection amount can be controlled. Further, the term "metal oxide" as used herein means a metal oxide having electrical conductivity or a metal oxide which has been oxidized to such an extent as have electrical conductivity.

According to the present invention, it is preferable that the electric charge injection suppressing layer is formed by reactive deposition of a metal in an oxidative gas or by oxidation by means of oxygen or moisture in the air. According to such case as described above, it is possible to produce the metal oxide in an easy inexpensive manner.

According to the present invention, it is preferable that the electric charge injection suppressing layer contains an organic material or inorganic material having electric charge transferability. According to such case as described above, the electric charge injection suppressing layer can be formed by using a method such as a vacuum deposition or spin-coat coating in an inexpensive manner.

According to the present invention, it is preferable that the electric charge injection suppressing layer is formed by a counter sputter method or a sputter method using ECR plasma. A film-forming method utilizing the counter sputter method or the sputter method using ECR plasma is different from an RF sputter method which is utilized at the time of forming a film by using an ordinary insulating material and ions from an irradiation source are hardly directly irradiated. Therefore, since a damage on an under layer can extremely be reduced, an article of higher quality can be provided and, further, lamination on the organic layer can easily be performed.

According to the present invention, it is preferable that the organic bistable compound is a compound represented by the formula (I) described below.

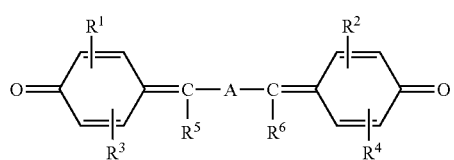

In the formula (I), $R^1$ to $R^4$ each represent a group selected from among a hydrogen atom, an alkyl group having from 1 to 6 carbon atoms which may have a substituent and an aryl group which may have a substituent, wherein $R^1$ to $R^4$ may be same with or different from one another; $R^5$ and $R^6$ each represent an aryl group which may have a substituent or a heterocyclic group which may have a substituent, wherein $R^5$ and $R^6$ are same with or different from each other; and A represents a group selected from among groups (1) to (10) described below.

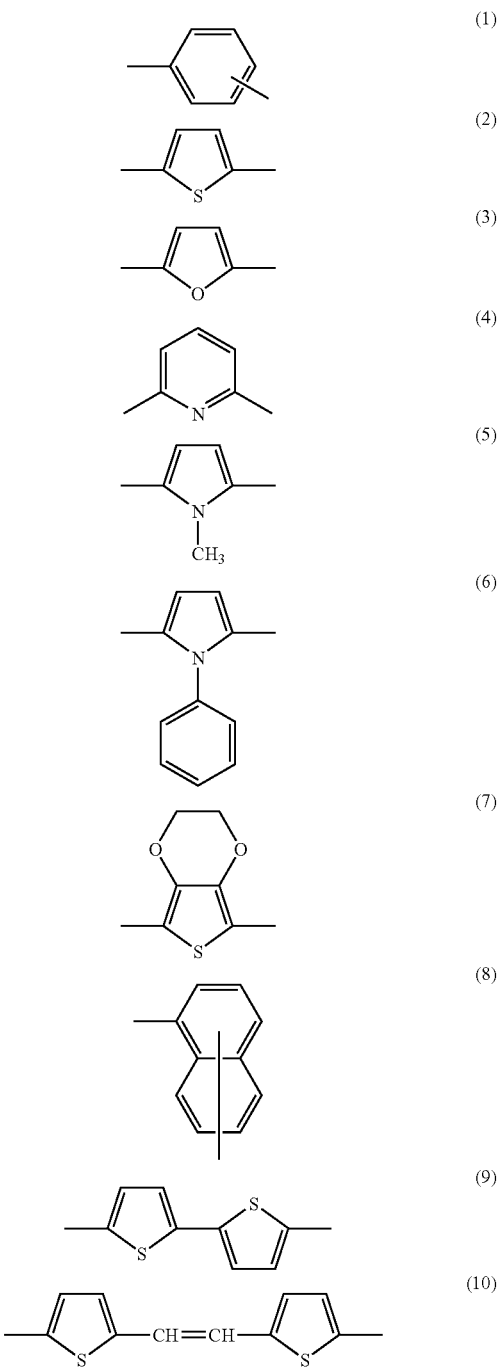

According to such case as described above, since each of such quinomethane type compounds as described above has a low LUMO level, electron injection from the first electrode thereof is easily conducted and, also, since it has a quinone group which is a functional group having an electron-accepting property, it not only has electron transportability, but also shows an excellent bistable property and, accordingly, it can favorably used in the present invention.

According to the present invention, when the organic bistable compound is a compound represented by the above-described formula (I), it is preferable that the first electrode layer contains aluminum; and the second electrode contains gold. In such case as described above, aluminum is low in an absolute figure of a work function among electrode materials, namely, is apt to release electrons, while, gold is high in the absolute figure of the work function among electrode materials, namely, is hard to release the electrons and, then, injection of electric charges are apt to be performed and, therefore, it can favorably be used as a combination of electrodes in the invention.

According to the present invention, in the switching device in which the organic bistable material is provided between electrodes, switching characteristics can be stabilized by enhancing transfer probability.

BRIEF DESCRIPTION OF THE DRAWINGS

The invention will be described in greater detail with reference to certain preferred embodiments and the accompanying drawings, wherein.

DETAILED DESCRIPTION OF THE PREFERRED EMBODIMENTS

Figure 1A:
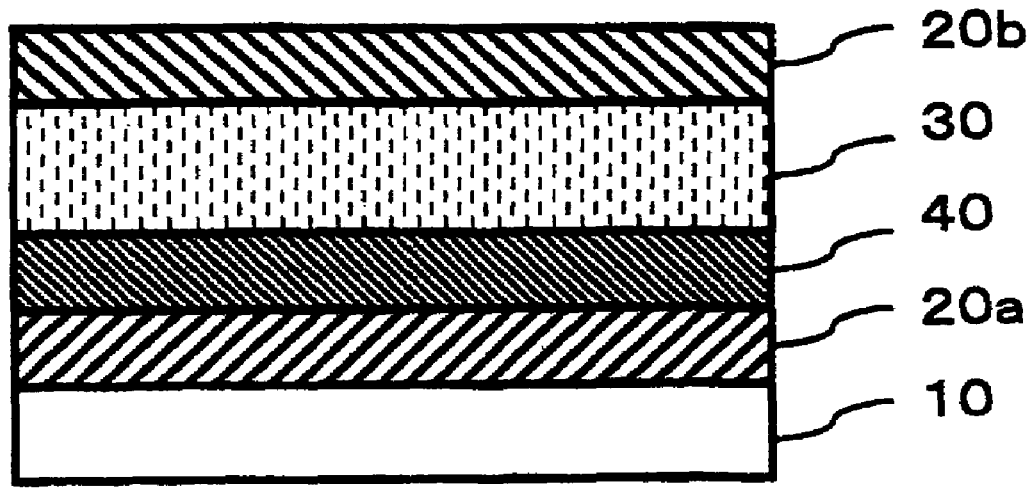
FIG. 1 is a schematic block diagram showing an embodiment of a switching device according to the present invention.

Hereinafter, the present invention will be described in detail with reference to the accompanying drawings. FIG. 1 is a schematic block diagram showing an embodiment of a switching device according to the present invention. As shown in FIG. 1a, the switching device is constituted such that a first electrode layer 20a, an electric charge injection suppressing layer 40, an organic bistable material layer 30 and a second electrode layer 20b are sequentially laminated in the stated order on a substrate 10.

Figure 1B:
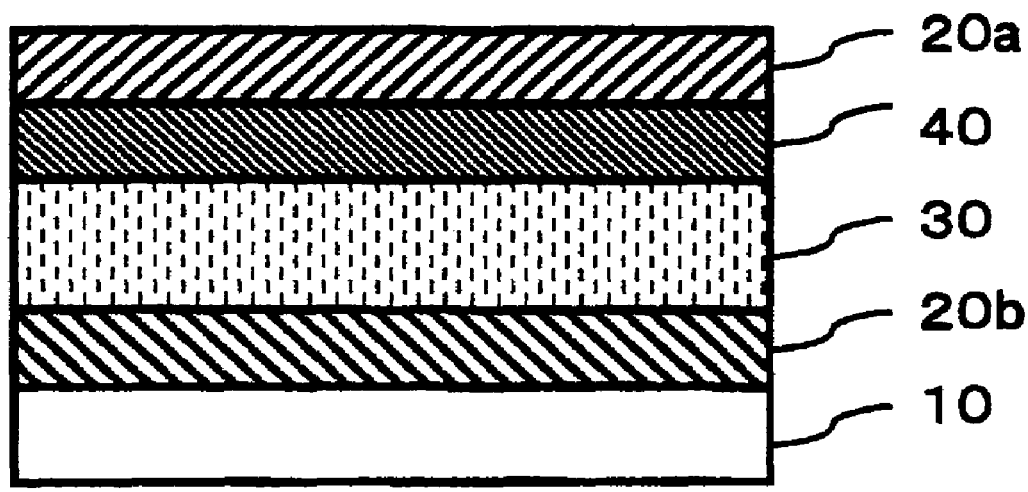

Also, as show in FIG. 1b, the switching device is constituted such that a second electrode layer 20b, an organic bistable material layer 30, an electric charge injection supporting layer 40 and a first electrode layer 20a are sequentially laminated in the stated order on a substrate 10. The substrate 10 is not particularly limited and a known glass substrate or the like is favorably used.

As for the first electrode layer 20a and the second electrode layer 20b, metallic materials such as aluminum, gold, silver, nickel and iron, inorganic materials such as ITO and carbon, organic materials such as a conjugated-system organic material and liquid crystal, semiconductor materials such as silicon, or the like can appropriately be selected, though the present invention is not particularly limited thereto.

Among other things, as for the organic bistable compound contained in the organic bistable material layer 30 to be described below, for example, when the quinomethane compound represented by the above-described formula (I) is used, it is preferable that the first electrode layer 20a which is provided adjacently to the electric charge injection suppressing layer 40 is an aluminum electrode, while the second electrode layer 20b which is provided adjacently to the organic bistable material layer 30 is a metallic electrode. Aluminum is low in an absolute figure of a work function (WF) among electrode materials, namely, is apt to release electrons, while, gold is high in the absolute figure of the work function among electrode materials, namely, is hard to release the electrons and, then, injection of electric charges are apt to be performed and, therefore, it can favorably be used.

The term "absolute figure of work function" of a first electrode layer or a second electrode layer means a minimum energy required for removing an electron from a surface of a given material and is an inherent value to the electrode material. The work function can be measured by photoelectron emission spectrum in the air. As for electrode materials each having a low absolute figure of the work function, besides aluminum, lithium, magnesium, calcium, silver and the like can be mentioned, while, as for electrode materials each having a high absolute figure of the work function, besides gold, chromium, platinum, ITO and the like can be mentioned.

As for a production method for the fist electrode layer 20a or the second electrode layer 20b, a known thin-film forming method such as a vacuum deposition method or the like can be mentioned, though the present invention is not particularly limited thereto. When a thin film is formed by the vacuum deposition, a substrate temperature at the time of the deposition is appropriately selected depending on the electrode material to be used and is preferably from 0 to 150° C. A film thickness of each electrode layer is preferably from 50 to 200 nm.

Next, as for the organic bistable compound to be used in the organic bistable layer 30, a compound, having a functional group for transporting electric charges, which contains a compound having both a functional group having an electron-donating property and a functional group having an electron-accepting property in a molecule is preferred.

As for such functional groups each having the electron-donating property, $-SCH_3$, $-OCH_3$, $-NH_2$, $-NHCH_3$, $-N(CH_3)_2$ and the like are mentioned, while, as for such functional groups each having the electron-accepting property, $-CN$, $NO_2$, $-CHO$, $-COCH_3$, $-COOC_2H_5$, $-COOH$, $-Br$, $-Cl$, $-I$, $-OH$, $-F$, $=O$ and the like are mentioned, though the invention is not limited thereto.

As for such compounds each having both the functional group having the electron-donating property and the functional group having the electron-accepting property in a molecule as described above, organic bistable compounds such as aminoimidazole type compounds, dicyano type compounds, pyridone type compounds, styryl type compounds, stilbene type compounds, a quinomethane type compounds, and butadiene type compound are mentioned, though the present invention is not particularly limited thereto.

Among the above-described compounds, it is preferable that the organic bistable compounds are quinomethane compounds represented by the formula (I) described below.

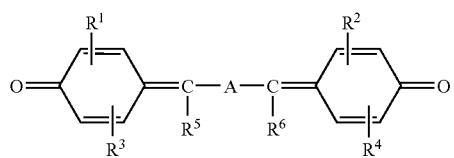

In the formula (I), $R^1$ to $R^4$ each represent a group selected from among a hydrogen atom, an alkyl group, having from 1 to 6 carbon atoms, which may have a substituent, and an aryl group which may have a substituent, in which $R^1$ to $R^4$ may be same with or different from each other; $R^5$ and $R^6$ each represent either of an aryl group which may have a substituent or a heterocyclic group which may have a substituent, in which $R^5$ and $R^6$ may be same with or different from each other; A represents a group selected from among groups (1) to (10) described below.

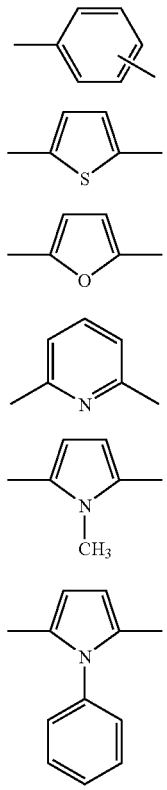

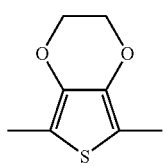

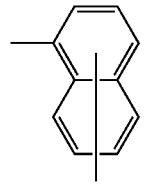

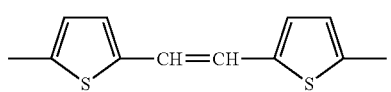

The above-described quinomethane type compound (I) can be synthesized by, for example, such reaction formulae as shown below. Compounds described below are examples in which A represents (2) or (3) (X represents oxygen or sulfur).

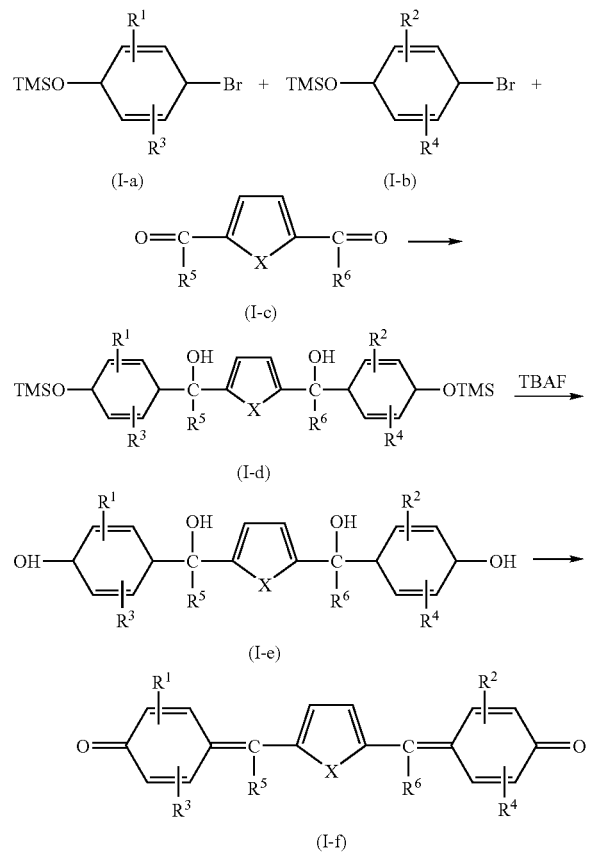

Namely, the compound (I-a), the compound (I-b) and the compound (I-c) are allowed to react with one another in the presence of an appropriate organometallic catalyst such as n-butyl lithium to prepare the compound (I-d) and, then, TMS (trimethyl silyl group) which is a protective group is removed therefrom to synthesize the compound (I-e) and, thereafter, dehydrocondensation is performed thereon by using a catalyst such as p-toluene sulfonic acid, to thereby obtain the quinomethane type compound (I). TBAF in the above-described reaction formulae represents fluorinated tetrabutyl ammonium. Further, the above-described synthetic methods are described in detail in, for example, JP-A-2003-228185, JP-A-2003-238561, and Japanese Patent Application No. 2003-105039.

As for such quinomethane type compounds as described above, specifically, for example, compounds represented by the formulae (I-1) to (I-32) described below can be mentioned.

(I-1)

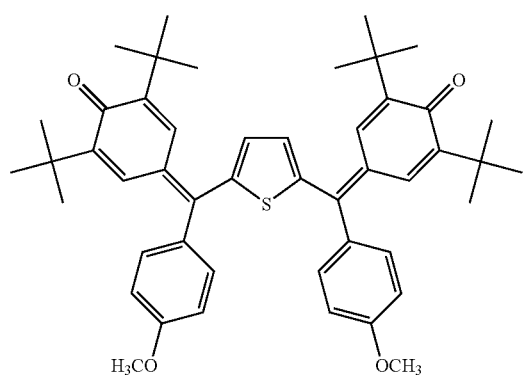

(I-2)

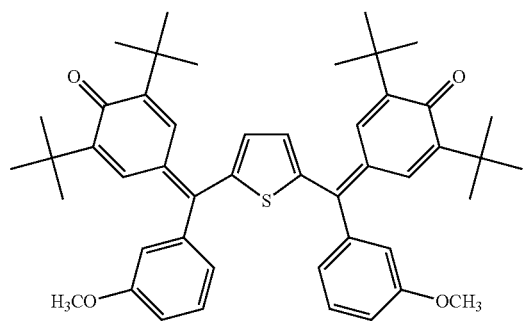

(I-3)

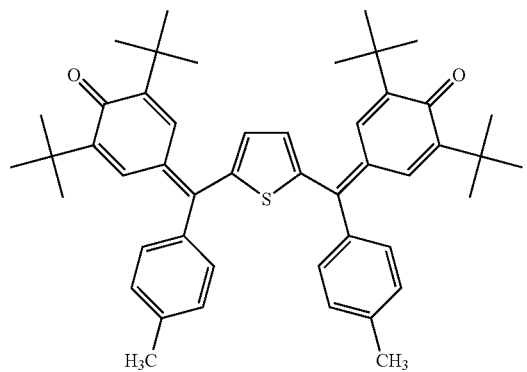

(I-4)

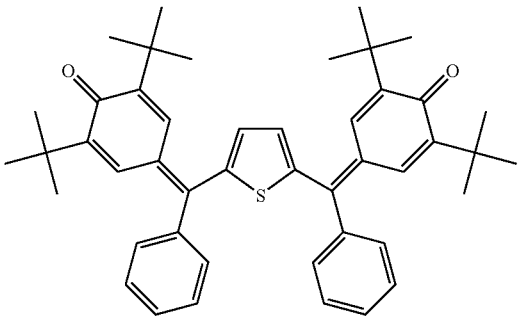

(I-5)

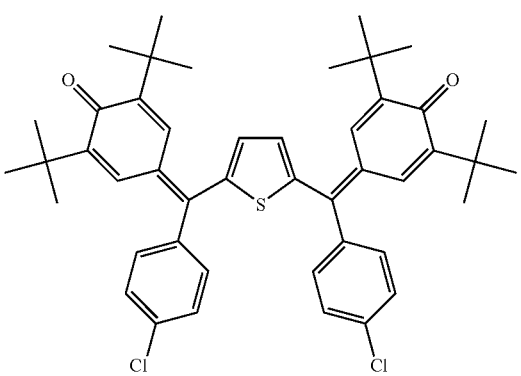

(I-6)

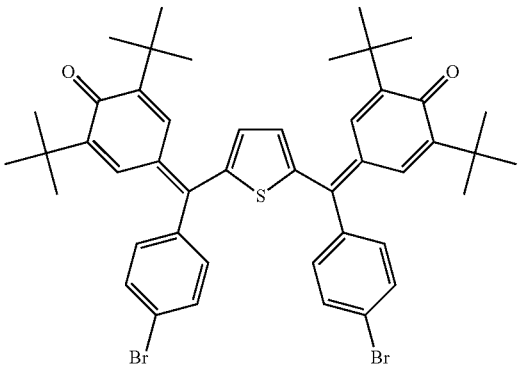

(I-7)

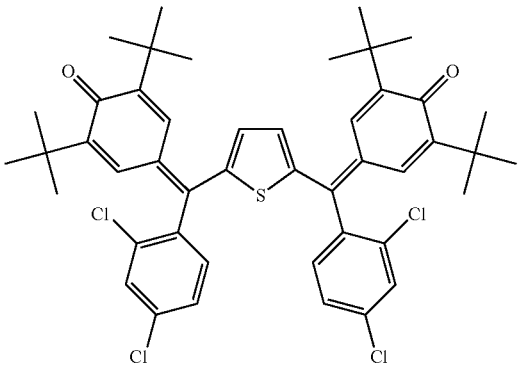

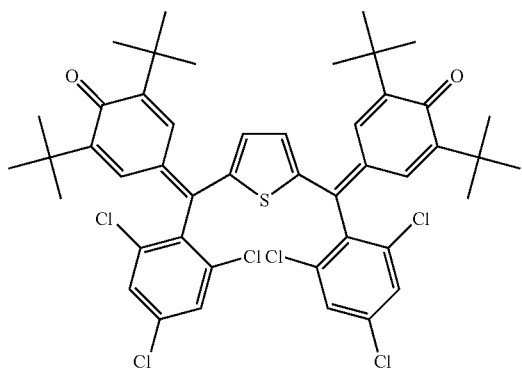
(I-8)
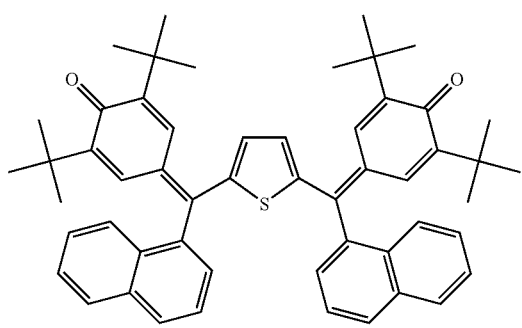
(I-9)
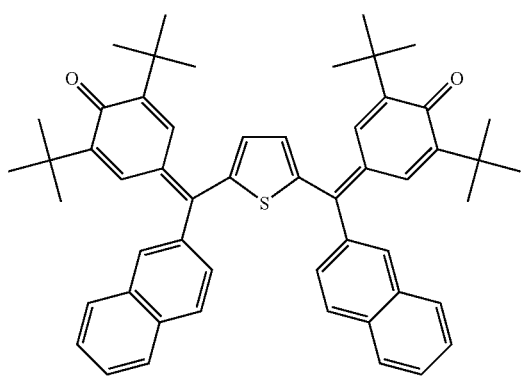
(I-10)
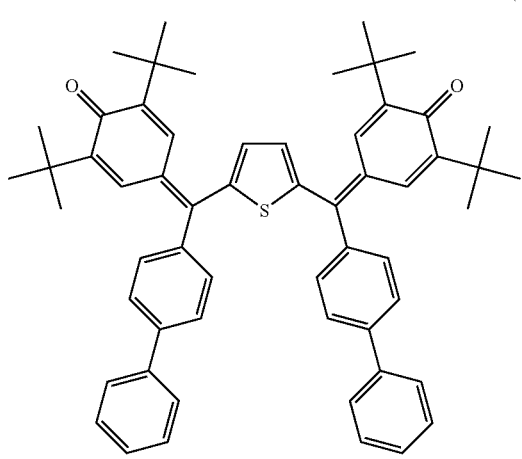
(I-11)
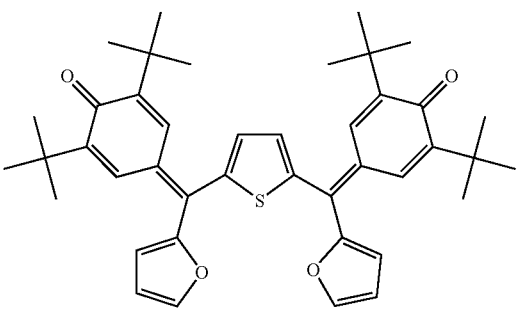
(I-12)
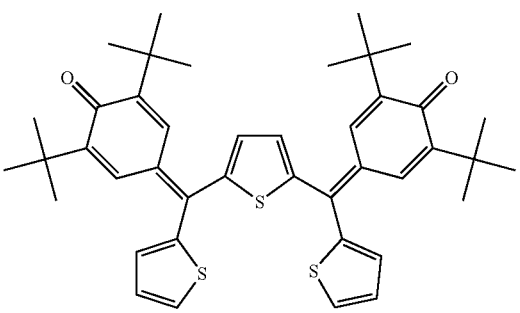
(I-13)
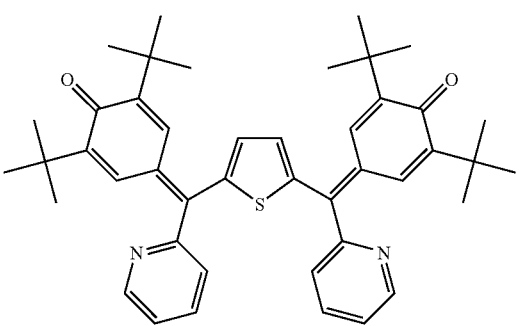
(I-14)
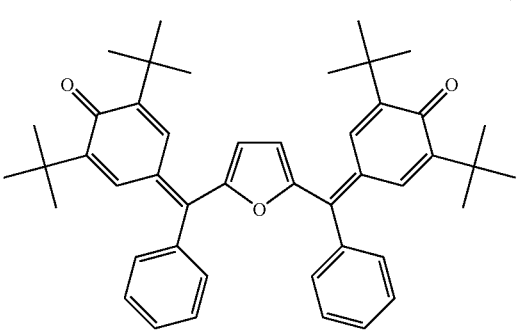
(I-15)

-continued
(I-16)
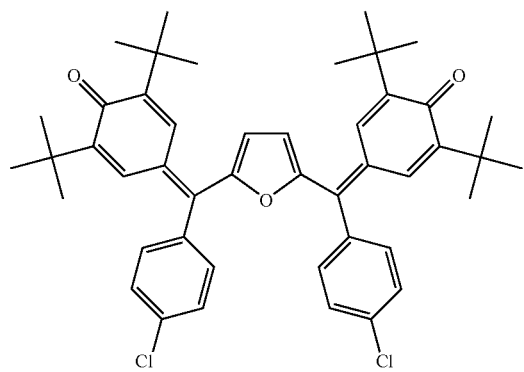
(I-17)
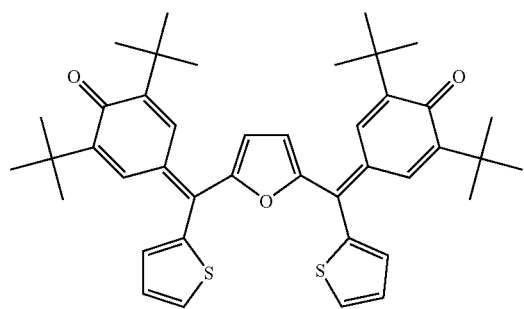
(I-18)
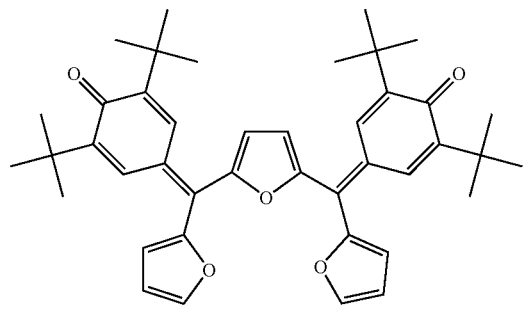
(I-19)
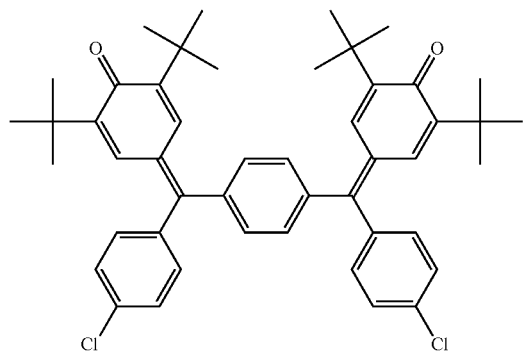
-continued
(I-20)
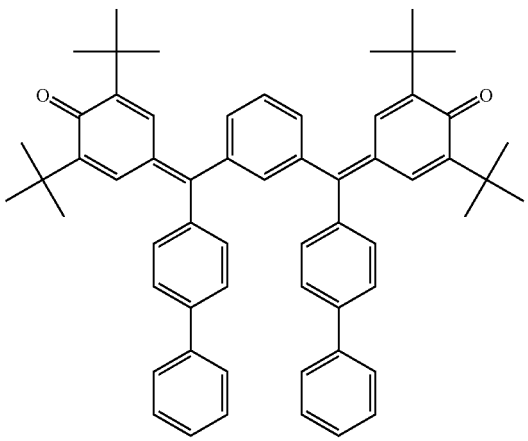
(I-21)
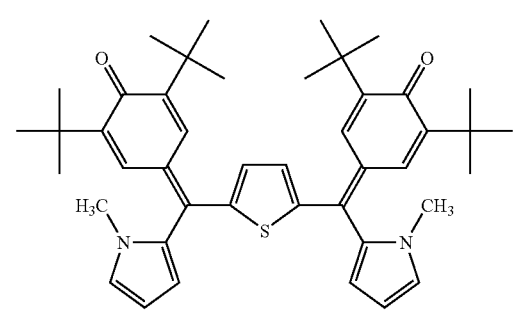
(I-22)
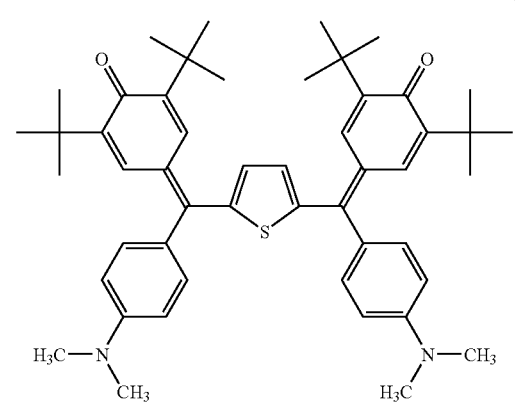
(I-23)
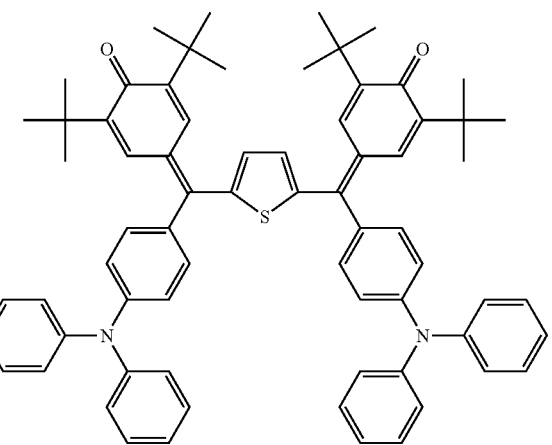

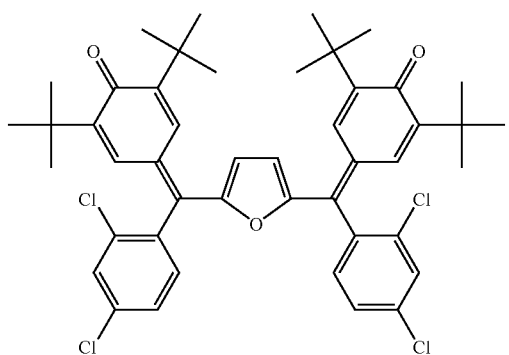
(I-24)
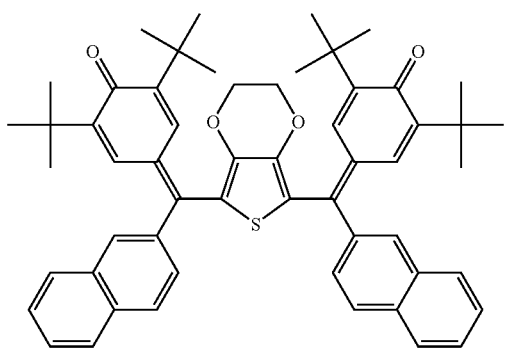
(I-28)
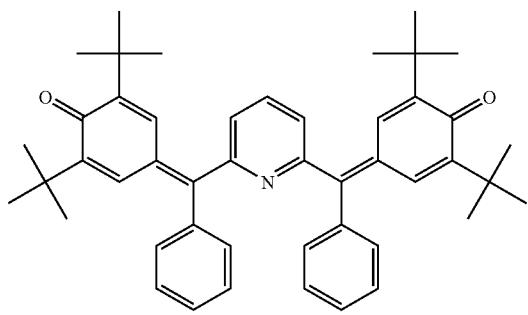
(I-25)
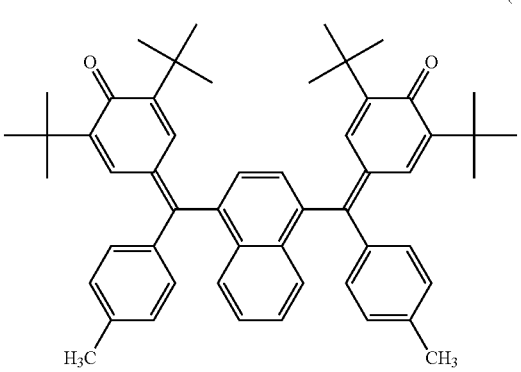
(I-29)
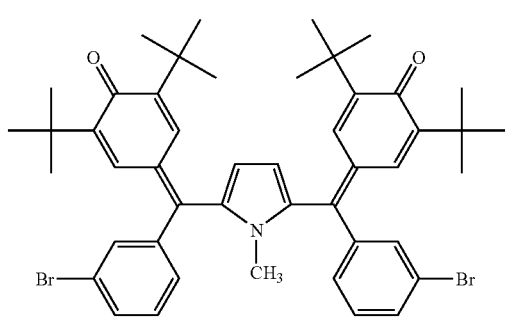
(I-26)
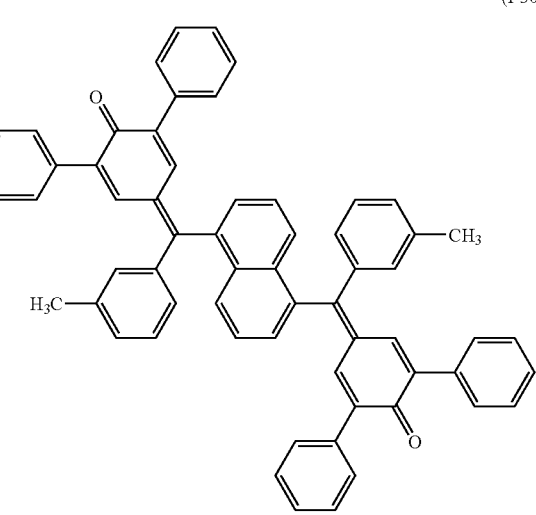
(I-30)
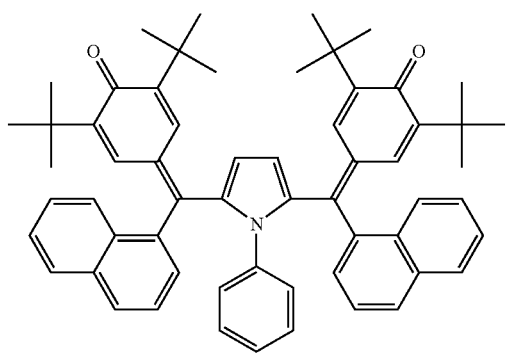
(I-27)
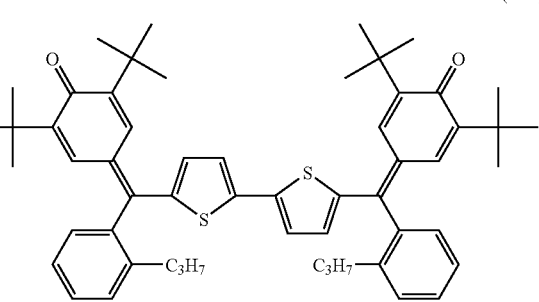
(I-31)

-continued (I-32)

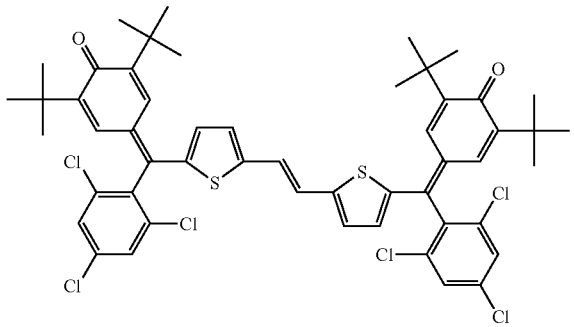

(Among the above-described compounds I-1 to I-32, "+" as a substitute represents a t-butyl group.)

As for production methods for the above-described organic bistable material layer 30, a vacuum deposition method, a spin coat method, an electrolytic polymerization method, a chemical vapor deposition method (CVD method), a monomolecular film cumulative method (LB method), a dip method, a bar coat method, an ink-jet method, a screen printing method and the like are mentioned, though the present invention is not particularly limited thereto.

When the organic bistable material layer 30 is formed by the vapor deposition method, the substrate temperature at the time of deposition is appropriately selected depending on the organic bistable material to be used and is preferably from 0 to 100° C. Further, the film thickness is preferably from 20 to 150 nm.

When the organic bistable material layer 30 is formed by coating by means of the spin coat method or the like, as for coating solvents, for example, halogen type solvents such as dichloromethane, dichloroethane, and chloroform, ether type solvents such as tetrahydrofuran (THF), and ethylene glycol dimethyl ether, aromatic type solvents such as toluene, and xylene, alcohol type solvents such as ethyl alcohol, ester type solvents such as ethyl acetate, butyl acetate, ketone type solvents such as acetone, and MEK, acetonitrile and the like can be used.

The organic bistable material is added in any one of these solvents in the range of from 0.001 to 30% by mass and dissolved therein and, then, optionally, added with a binder resin, to thereby prepare a coating solution. As for such binder resins, for example, polycarbonate, polyester, polyvinyl alcohol and polystyrene can be used. A condition of spin coat may appropriately be set in accordance with a targeted film thickness and, on this occasion, a rotation number is preferably in the range of from 200 to 3600 rpm.

Next, the electric charge injection suppressing layer 40 is described in detail. In an embodiment as shown in FIG. 1a, the electric charge injection suppressing layer 40 is provided between the first electrode layer 20a which is adjacent to the substrate 10 and the organic bistable material layer 30. Further, according to the present invention, as shown in FIG. 1b, the electric charge injection suppressing layer 40 may be provided between the first electrode layer 20a which is not adjacent to the substrate 10 and the organic bistable material layer 30.

The electric charge injection suppressing layer 40 is required to have an electrically conductive property. When it does not have the electrically conductive property, since an electric charge accumulation does not occur in the organic bistable material layer 30, transfer to the on state is not performed and, accordingly, a bistable property does not appear. Further, the electric charge injection suppressing layer 40 is a layer which allows an electron injection amount into the organic bistable material layer 30 to be small and preferably suppresses the amount to $1/10$ or less.

When the electric charge injection amount into the organic bistable material layer 30 is not suppressed to $1/10$ or less, by the electric charge injection suppressing layer 40, the electric charge injection amount becomes unduly large, the off state can not be maintained, the bistable property itself does not appear; such feature as described above is not preferred.

A ratio of suppressing the electric charge injection amount is a ratio of the electric charge injection amount at a same voltage in a case in which the electric charge injection amount at the time of injecting the electric charge from the first electrode layer directly to the organic bistable material layer without providing the electric charge injection suppressing layer is taken as 1 and is a comparison with a current value in an off state under a same voltage.

Further, it is preferable that volume resistivity of the electric charge injection suppressing layer 40 is from $10^5$ to $10^7$ Ωcm. On this occasion, it is preferable that a film thickness is from 10 to 200 nm.

In a case in which the volume resistivity of the electric charge injection suppressing layer 40 is less than $10^5$ Ωcm, the electric charge injection amount comes to be unduly large and, then, the off state can not be maintained and, accordingly, a rectification property is generated, while, in a case in which the volume resistivity of the electric charge injection suppressing layer 40 is larger than $10^7$ Ωcm, transfer to the on state can not be performed and, accordingly, an insulation property is generated. In both cases, the bistable property does not appear, which is not favorable. By allowing the volume resistivity of the electric charge injection suppressing layer 40 to be in the above-described range, the bistable property can be obtained.

Figure 10:
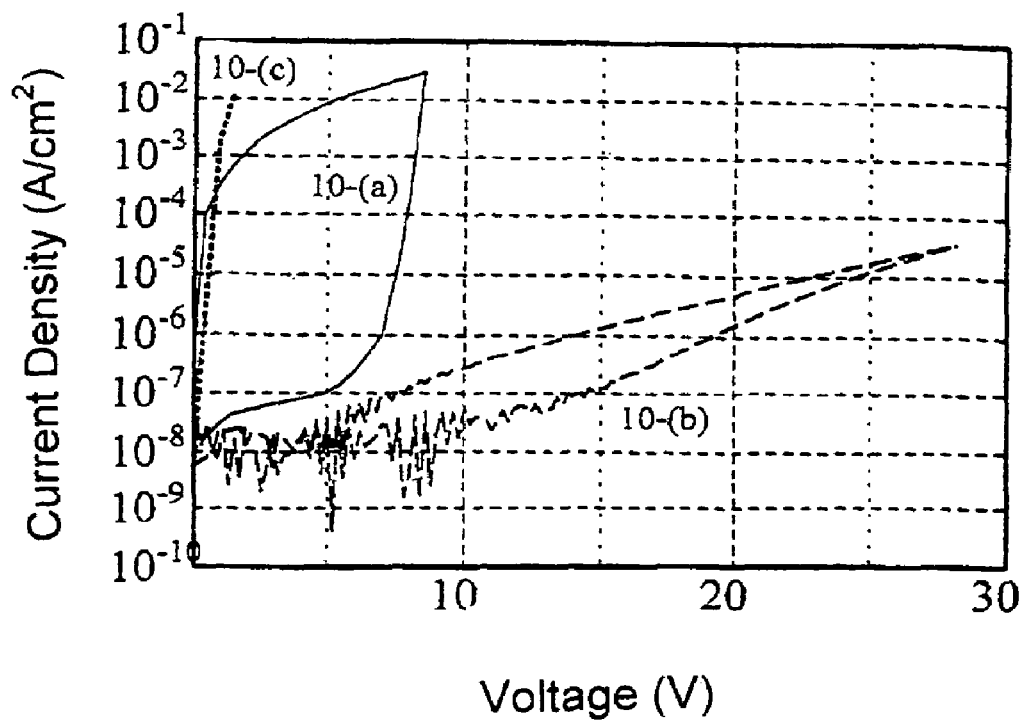
FIG. 10 is a graph showing current-voltage characteristics by using electric charge injection suppressing layers having different volume resistivity from one another.

Namely, as shown in FIG. 10, when the volume resistivity of the electric charge injection suppressing layer 40 is in the above-described range or less, a rectification state like 10-(c) is generated. Further, when the volume resistivity of the electric charge injection suppressing layer 40 is over the above-described range, an insulation state like 10-(b) is generated and, then, the bistable property does not appear. However, so long as the volume resistivity of the electric charge injection suppressing layer 40 is within the above-described range, the bistable property like 10-(a) can be obtained.

Further, 10-(a), 10-(b) and 10-(c) are current-voltage characteristics of switching devices which use the electric charge injection suppressing layers having volume resistivity of $10^6$ Ωcm, $10^8$ Ωcm, and $10^4$ Ωcm, respectively.

As for the electric charge injection suppressing layer 40, a metal oxide, or an organic material or inorganic material having electric charge transferability is preferably used.

The term "metal oxide" as used herein means a metal oxide having electrical conductivity or a metal oxide which has been oxidized to such an extent as have electrical conductivity. As for metals of such metal oxides, various types of materials are used; for example, aluminum, copper, silica, calcium, lithium, indium or tin can appropriately be selected. Though the present invention is not particularly limited thereto, when the compound represented by the above-described formula (I) is used as an organic bistable compound, it is preferable to use aluminum from the standpoint of consistency to the energy level. On this occasion, the oxide of aluminum may be completely-dehydrated alumina or an alumina hydrate.

Such aluminum oxide as described above may be formed by a reactive deposition in which aluminum is vacuum deposited in oxygen or water vapor or may be formed by leaving it in a controlled atmosphere of air.

The reactive deposition can be performed by a known depositing apparatus in a same condition as in the above-described organic bistable material layer 30 and, on this occasion, the substrate temperature is preferably from 0 to 150° C. Further, as for degrees of vacuum, after a degree of vacuum of $10^{-5}$ torr or less is once set, in a case of the reactive deposition, for example, in oxygen, it is preferable to deposit aluminum at an oxygen partial pressure of $10^{-4}$ torr or less, desirably from $3\times10^{-5}$ to $3\times10^{-6}$ torr. Further, a film thickness is preferably from 3 to 100 nm and, more preferably, from 5 to 30 nm.

In the case of leaving aluminum in an atmosphere of the air, it is preferable to leave an aluminum film obtained by vacuum deposition at a degree of vacuum of $10^{-5}$ torr or less by using, for example, a known deposition apparatus under conditions of constant temperature and constant humidity in the air. Conditions of such leaving are not particularly limited and, for example, by leaving it for from 10 to 100 hours under conditions of 40° C. 80% RH, a desired oxide film can be obtained.

Organic materials having electric charge transferability are not particularly limited and various types of compounds having electric charge transferability, for example, alumiquinoline compounds represented by the formula (II) described below, amine compounds represented by the formula (III), styryl compounds represented by the formula (IV), and imine compounds represented by the formula (V) can be used.

As for a method for forming a thin film of any one of the above-described organic materials having electric charge transferability, the thin film can be formed by vacuum deposition or coating such as spin coat in a same condition as in the above-described organic bistable material layer 30. When the spin coat is adopted, as for coating solvents, THF which easily dissolves the material is preferred.

The organic material is dissolved in this coating solvent in the range of from 0.001 to 30% by mass and, optionally, added with a binder resin, to thereby prepare a coating solution. As for such binder resins, for example, polycarbonate, polyester, polyvinyl alcohol, and polystyrene can be used. Conditions of the spin coat can appropriately be set in accordance with a targeted film thickness. On this occasion, a rotation number is preferably in the range of from 200 to 3600 rpm and, further, a film thickness is preferably from 3 to 200 nm.

The organic materials having electric charge transferability are not particularly limited and such polyimide films as represented by the formula (VI) are favorably used. Further, the inorganic materials having electric charge transferability are not particularly limited and silicon oxide ($SiO_2$), a material having a boron nitride structure (material having a c-BN structure or an h-BN structure) and the like are favorably used.

(VI)

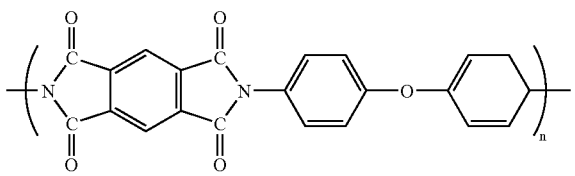

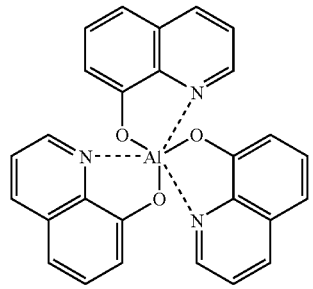
(II)

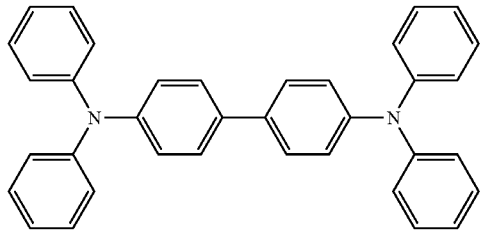
(III)

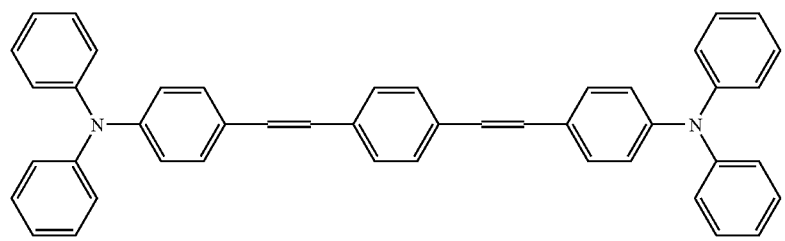
(IV)

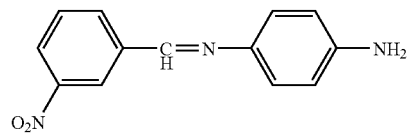
(V)

As for a method for forming a thin film of any one of the above-described organic/inorganic materials having electric charge transferability, a film forming method such as an RF sputter method, a counter sputter method, an ECR plasma method can be used. Among these method, the counter sputter method or the ECR plasma method is preferred, since it hardly damage a lower layer at the time of forming a thin film and can favorably used at the time of being laminated on an organic film.

In a case of the counter sputter method, it is preferable, for example, in an atmosphere of an Ar gas, to apply electric power in direct current, or to apply a microwave having a frequency of from 10 to 500 MHz under a pressure of from $10^{-2}$ to $10^{-5}$ Torr, or to apply a microwave having a frequency of from 1 to 10 GHz under a pressure of from $10^{-4}$ to $10^{-6}$ Torr. A film thickness is preferably from 10 to 300 nm. When the electric power in direct current is applied, the pressure is not particularly limited.

In a case of the ECR plasma method, for example, in an atmosphere of an Ar gas or $N_2$ gas, it is preferable to use a high frequency wave of from 300 MHz to 3 GHz under a pressure of $10^{-4}$ Torr or less. Further, it is preferable that an electron density is from $10^8$ to $10^{12}$ cm$^{-3}$ and has energy of from 100 to 1000 eV as a distribution center. A film thickness is preferably from 10 to 300 nm.

In the switching device according to the present invention produced in such a manner as described above, for example, electric charges injected from the first electrode layer 20a are injected into the organic bistable material layer 30 via the electric charge injection suppressing layer 40.

Specifically, when the first electrode layer 20a is earthed in an off state and plus voltage is applied to the second electrode layer 20b, electrons are injected from the first electrode layer 20a to the organic bistable material layer 30 via the electric charge injection suppressing layer 40. Then, when electric charge accumulation necessary for transfer to the on state is performed, for example, at an interface between the organic bistable material layer 30 and the second electrode layer 20b, a large portion of the voltage thus applied is applied on this interface and only a small portion of the voltage is applied on the electric charge injection suppressing layer 40. For this account, the electric charges to be injected in the off state come to be of small amount.

In this state, when the voltage is increased and the above-described electric charge accumulation is increased, it is considered that a transfer to the on state is performed and electric resistance of the device is decreased. For this account, it is assumed that almost all of electric field to be applied is added to the electric charge injection suppressing layer 40 and, then, a large current can be obtained.

For this account, when the electric resistance of the electric charge injection suppressing layer 40 is unduly small, since the electric charge injection in the off state comes to be large and, further, the electric field of a portion at which the electric charges are accumulated comes to be large, the transfer from the off state to the on state easily occurs at a low voltage and, then, only the on state can be observed and, therefore, the bistable property can not be obtained.

On the other hand, when the electric resistance of the electric charge injection suppressing layer 40 is unduly large, since the electric charge accumulation comes to be small and, further, the electric field of a portion at which the electric charges are accumulated comes to be small, the transfer from the off state to the on state does not easily occur even at a high voltage and, then, only the off state can be observed and, therefore, the bistable property can not be obtained.

However, according to the present invention, since the electric resistance is appropriately adjusted the electric charge injection suppressing layer 40, the above-described bistable property can easily be obtained. Therefore, appearance probability (transfer probability) of devices which perform switching can be enhanced and fluctuation of the transfer voltage can be reduced, to thereby stabilize the switching characteristics.

Hereinafter, the switching device according to the present invention is described in detail with reference to embodiments

EXAMPLE 1

In accordance with procedures to be described below, a switching device having a constitution as shown in FIG. 1a was prepared. Namely, while using a glass substrate as a substrate 10, a first electrode layer 20a, an electric charge injection suppressing layer 40, an organic bistable material layer 30, and a second electrode layer 20b are sequentially formed to be respective thin films by a vacuum deposition method in the stated order such that they came to be 100 nm, 10 nm, 60 nm and 100 nm, respectively, to thereby form the switching device according to Example 1.

As for a deposition source, namely, raw material, of each layer, aluminum is used as the first electrode layer 20a, gold is used as the second electrode layer 20b, and a quinomethane compound represented by the above-described formula (I-1) is used as the organic bistable material layer 30. Further, the electric charge injection suppressing layer 40 was formed by subjecting aluminum to reactive deposition in an atmosphere of an oxygen partial pressure of $3\times10^{-5}$ torr at a film-forming rate of 0.2 nm/s. Film forming of each layer except the electric charge injection suppressing layer 40 is performed at a degree of vacuum of $3\times10^{-6}$ torr or less. Further, vapor deposition is performed by a resistance heating method and the deposition apparatus was operated based on diffusion pump discharge.

EXAMPLE 2

A switching device according to Example 2 was obtained in a same condition as in Example 1, except that a thickness of the electric charge injection suppressing layer 40 was set to be 20 nm and a thickness of the organic bistable material layer 30 was set to be 80 nm.

EXAMPLE 3

A switching device according to Example 3 was obtained in a same condition as in Example 1, except that an oxygen partial pressure at the time of forming the electric charge injection suppressing layer 40 was set to be $1\times10^{-5}$ torr.

EXAMPLE 4

A switching device according to Example 4 was obtained in a same condition as in Example 1, except that an oxygen partial pressure at the time of forming the electric charge injection suppressing layer 40 was set to be $1\times10^{-4}$ torr.

EXAMPLE 5

A switching device according to Example 5 was obtained by performing film-forming in a same condition as in Example 1, except that a compound represented by the above-described formula (I-5) was used as a quinomethane compound and deposited layers, namely, the first electrode layer 20a, the electric charge injection suppressing layer 40, the organic bistable material layer 30, and the second electrode layer 20b were formed as films such that they had thicknesses of 100 nm, 10 nm, 80 nm and 100 nm, respectively.

EXAMPLE 6

A switching device according to Example 6 was obtained by performing film-forming in a same condition as in Example 1, except that an aluminoquinoline compound represented by the above-described formula (II) was used as a material for the electric charge injection suppressing layer 40 and the first electrode layer 20a, the electric charge injection suppressing layer 40, the organic bistable material layer 30 and the second electrode layer 20b were formed as films such that they had thicknesses of 100 nm, 10 nm, 80 nm and 100 nm, respectively.

EXAMPLE 7

A switching device according to Example 7 was obtained by performing film-forming in a same condition as in Example 1, except that, after aluminum is formed as the first electrode layer 20a, the electric charge injection suppressing layer 40 is formed (thickness being 10 nm) by leaving the thus-formed aluminum in the air for 48 hours in conditions of 40° C. 80% RH and, then, the organic bistable material layer 30 and the second electrode layer 20b were formed.

EXAMPLE 8

A switching device according to Example 8 was obtained by performing film-forming in a same condition as in Example 1, except that a polyimide film represented by the above-described formula (VI) was used as the electric charge injection suppressing layer 40 and, then, the first electrode layer 20a, the electric charge injection suppressing layer 40, the organic bistable material layer 30 and the second electrode layer 20b were formed as films such that they had thicknesses of 100 nm, 10 nm, 80 nm and 100 nm, respectively and, further, the electric charge injection suppressing layer was formed as a film in an atmosphere of an Ar gas by applying electric power in direct current under a pressure of $10^{-4}$ Torr by means of a counter sputter method such that it had a thickness of 10 nm.

EXAMPLE 9

A switching device according to Example 9 was obtained by performing film-forming in a same condition as in Example 1, except that $SiO_2$ was used as the electric charge injection suppressing layer 40 and, then, the first electrode layer 20a, the electric charge injection suppressing layer 40, the organic bistable material layer 30 and the second electrode layer 20b were formed as films such that they had thicknesses of 100 nm, 10 nm, 80 nm and 100 nm, respectively and, further, the electric charge injection suppressing layer was formed as a film in an atmosphere of an Ar gas by applying electric power in direct current under a pressure of $10^{-4}$ Torr by means of a counter sputter method such that it had a thickness of 10 nm.

EXAMPLE 10

A switching device according to Example 10 was obtained by performing film-forming in a same condition as in Example 1, except that boron nitride (material having a c-BN structure) was used as the electric charge injection suppressing layer 40 and, then, the first electrode layer 20a, the electric charge injection suppressing layer 40, the organic bistable material layer 30 and the second electrode layer 20b were formed as films such that they had thicknesses of 100 nm, 10 nm, 80 nm and 100 nm, respectively and, further, the electric charge injection suppressing layer was formed as a film by using a reactive sputter method using ECR plasma generated in an atmosphere of an $N_2$ gas by applying an electric field of $6.9 \times 10^4$ A/m with a frequency of 2.45 GHz under a pressure of $10^{-5}$ Torr such that it had a thickness of 10 nm.

COMPARATIVE EXAMPLE 1

A switching device according to Comparative Example 1 was obtained by performing film-forming in a same condition as in Example 1, except that the electric charge injection suppressing layer 40 was not formed and, then, the first electrode layer 20a, the organic bistable material layer 30 and the second electrode layer 20b were formed in the stated order.

COMPARATIVE EXAMPLE 2

A switching device according to Comparative Example 2 was obtained by performing film-forming in a same condition as in Example 1, except that the electric charge injection suppressing layer 40 was formed by using an RF sputter method such that it had a thickness of 70 nm.

EXPERIMENTAL EXAMPLE 1

Figure 11:
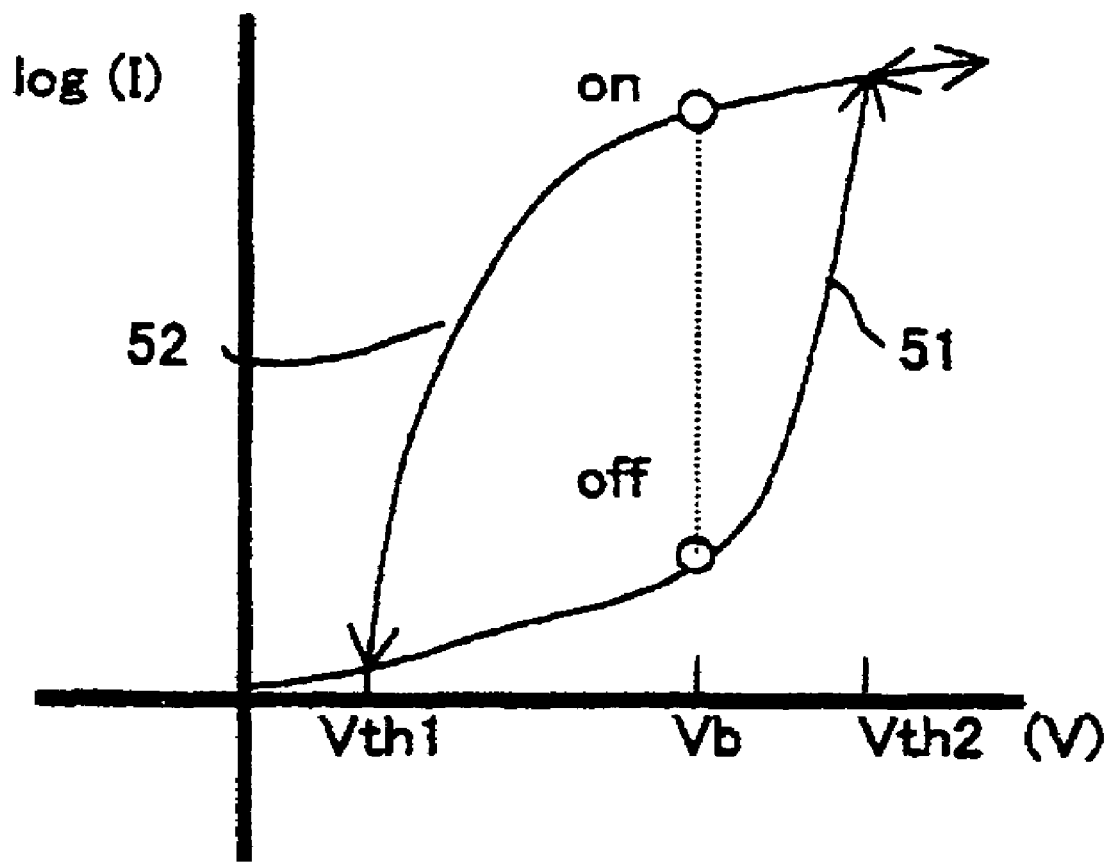
FIG. 11 is a graph showing a concept of current-voltage characteristics of a conventional switching device.

With reference to each of 50 switching devices each of the above-described Examples 1 to 10 and Comparative Examples 1 and 2, the current-voltage characteristics in a case in which the first electrode layer 20a was earthed and the second electrode layer 20b was allowed to be plus bias were measured in an-atmosphere of room temperature, to thereby obtain appearance probability (transfer probability) of device which perform switching (transfer), Vth2 which is a threshold voltage in FIG. 11 and a value of current density in the on state at the time of transfer. The results are shown in Table 1. In. FIGS. 2, 3, 4 and 5, the current-voltage characteristics of switching devices of Examples 1, 8, 9 and 10 are shown, respectively and, in FIGS. 6 and 7, the current-voltage characteristics of switching devices of Comparative Examples 1 and 2 are shown, respectively.

TABLE 1

|  | Transfer probability (%) | Vth2 average (V) | Vth2 standard deviation (V) | Current density (A/cm$^2$) |
|---|---|---|---|---|
| Example 1 | 96 | 21.2 | 4.0 | $1.0 \times 10^{-3}$ |
| Example 2 | 94 | 25.6 | 5.4 | $5.8 \times 10^{-4}$ |
| Example 3 | 96 | 6.6 | 1.5 | $7.2 \times 10^{-3}$ |
| Example 4 | 92 | 28.3 | 6.7 | $2.2 \times 10^{-4}$ |
| Example 5 | 86 | 19.4 | 4.6 | $4.2 \times 10^{-4}$ |
| Example 6 | 94 | 15.2 | 5.4 | $4.7 \times 10^{-4}$ |
| Example 7 | 86 | 9.4 | 3.4 | $6.7 \times 10^{-3}$ |
| Example 8 | 87 | 9.5 | 3.1 | $5.1 \times 10^{-3}$ |
| Example 9 | 80 | 13.8 | 4.5 | $1.3 \times 10^{-3}$ |
| Example 10 | 87 | 5.8 | 4.5 | $1.4 \times 10^{-3}$ |
| Comparative Example 1 | 68 | 7.9 | 2.5 | $2.8 \times 10^{-5}$ |
| Comparative Example 2 | 15 | 34.3 | 17.2 | $3.5 \times 10^{-6}$ |

* The current density is in the on state, and the value is a value when a voltage is 1 V.

From Table 1, it is found that a great increase of the transfer probability in Examples compared with Comparative Examples has been noticed. Further, from FIG. 2, it is found that, in Example 1, about 1000 or more is obtained as a rate of low resistance state/high resistance state and, then, a favorable result can be obtained as the bistable property.

Further, when the oxygen partial pressure at the time of reactive deposition becomes low as in Example 3, the transfer voltage comes to be low and, then, a high current density can be obtained, while, when the oxygen partial pressure at the time of the reactive deposition becomes high as in Example 4, the transfer voltage comes to be high and, then, the current density comes to be low.

Figure 3:
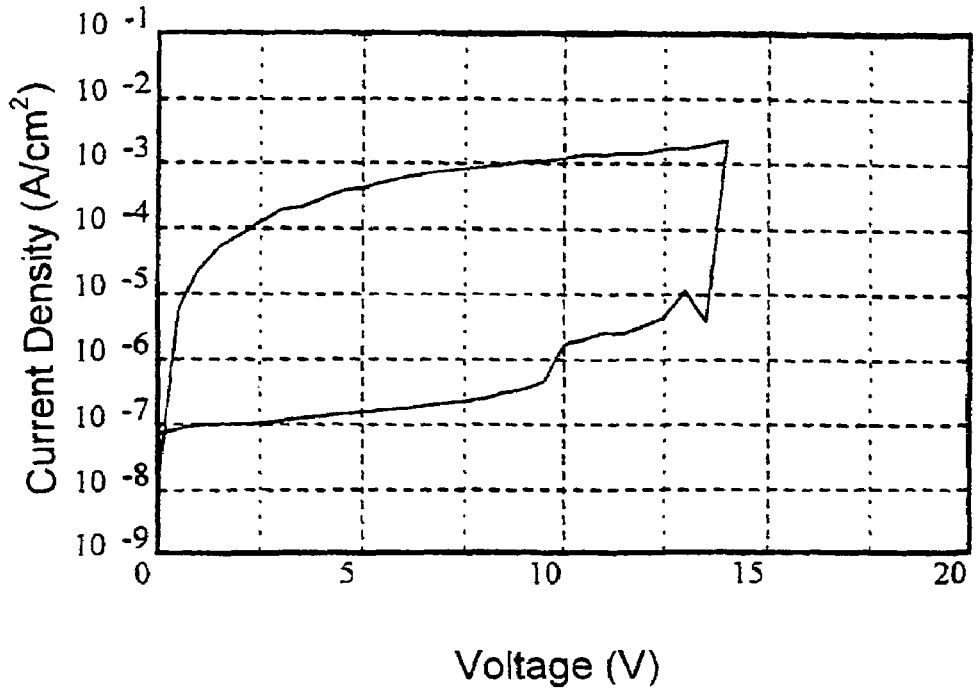
FIG. 3 is a graph showing current-voltage characteristics of the switching device according to Example 8.
Figure 4:
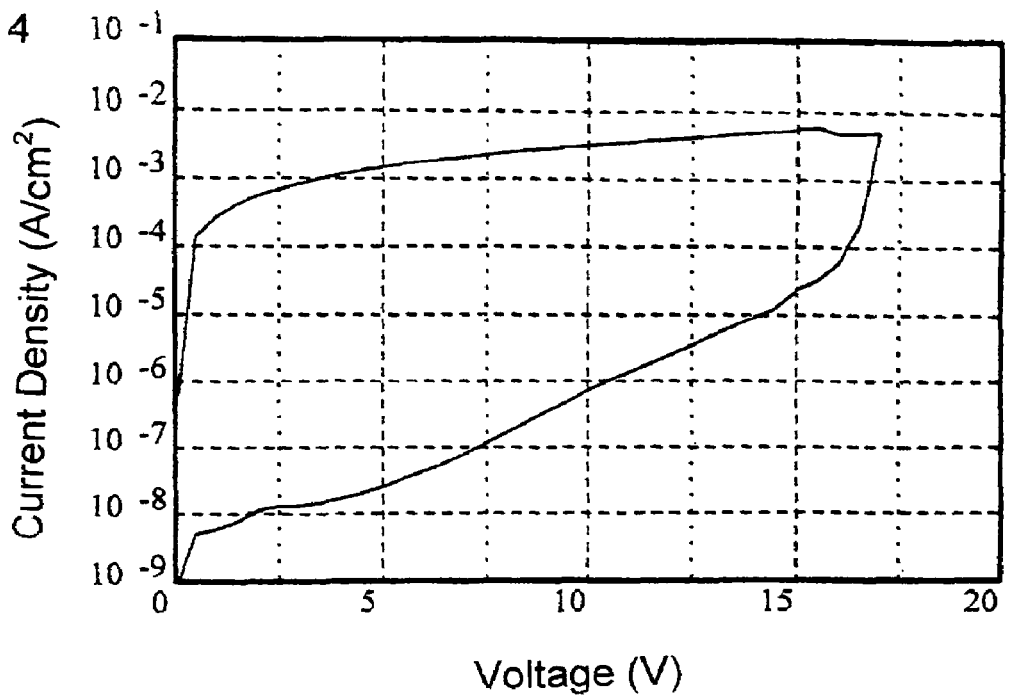
FIG. 4 is a graph showing current-voltage characteristics of the switching device according to Example 9.
Figure 5:
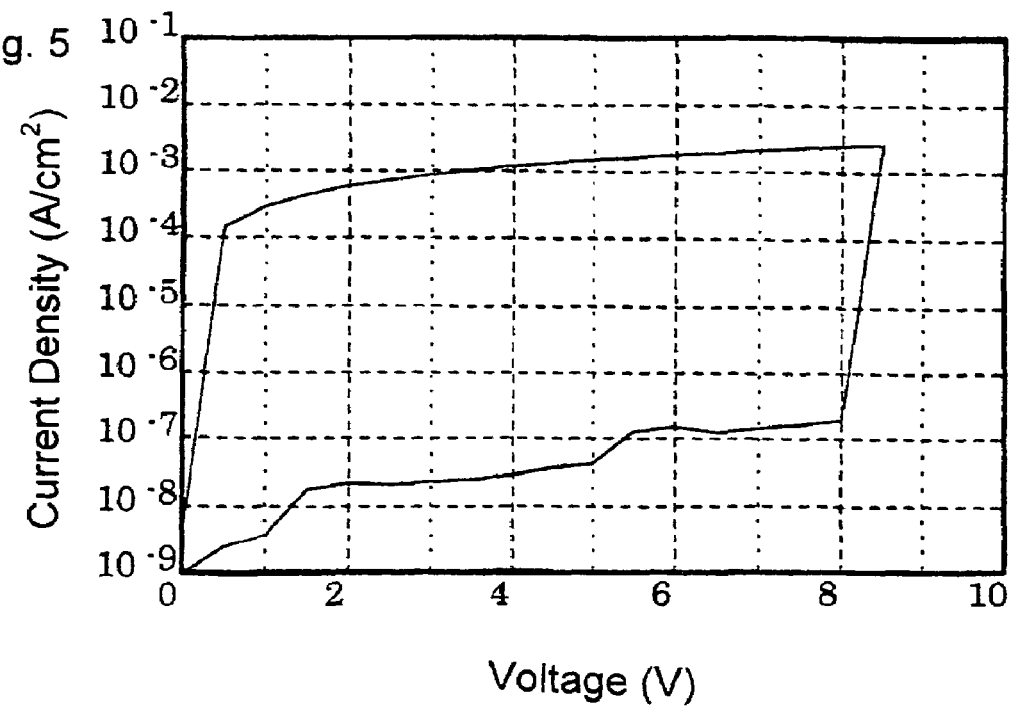
FIG. 5 is a graph showing current-voltage characteristics of the switching device according to Example 10.

FIGS. 3, 4 and 5 show examples of the switching device which is obtained in each of Examples 8, 9 and 10 by using an organic/inorganic material having electric charge transferability to an electric charge injection suppressing layer. About 1000 or more is obtained as a rate of low resistance state/high resistance state and, then, a favorable result can be obtained as the bistable property. Therefore, so long as electric conductivity of the switching portion can be maintained, electric resistance of the electric charge injection suppressing layer can be adjusted by using the organic/inorganic material having electric charge transferability.

Figure 6:
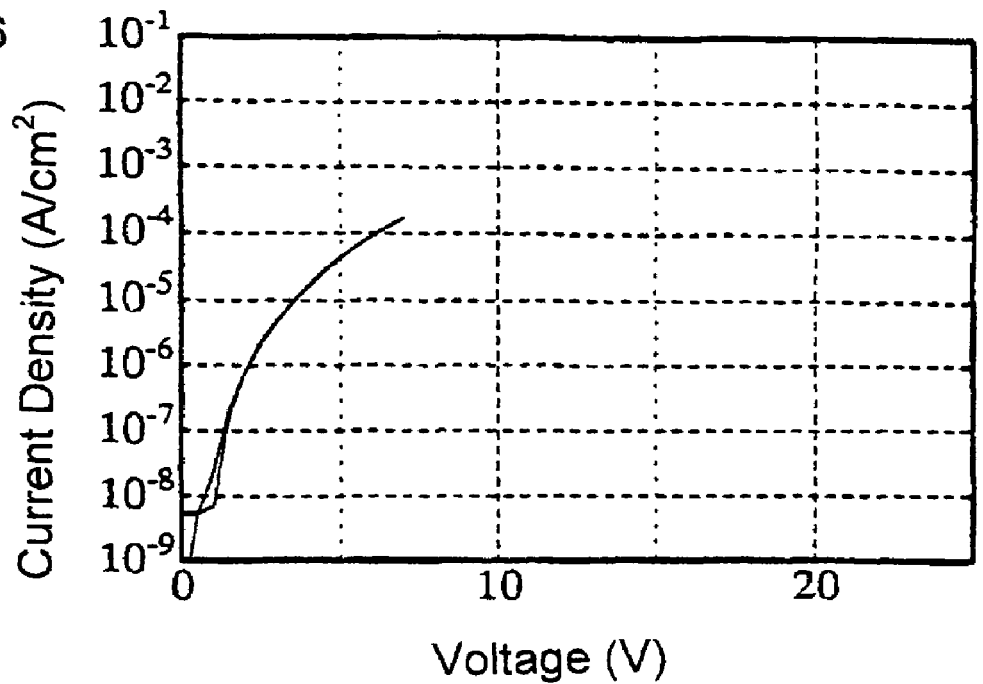
FIG. 6 is a graph showing current-voltage characteristics of the switching device according to Comparative Example 1.
Figure 7:
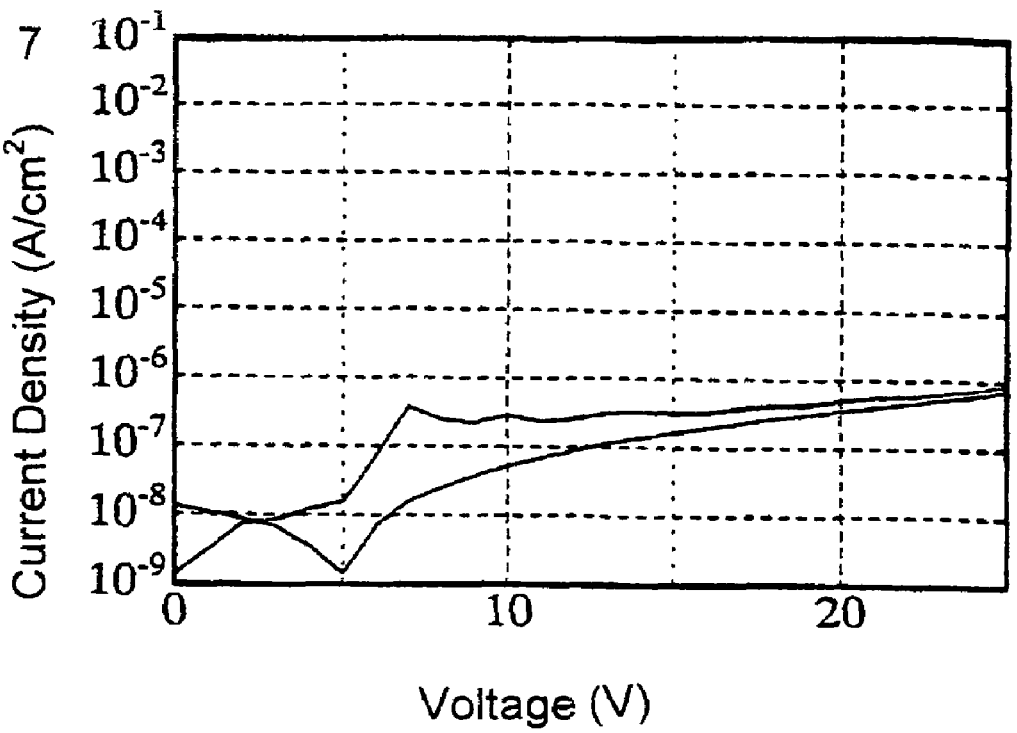
FIG. 7 is a graph showing current-voltage characteristics of the switching device according to Comparative Example 2.

On the other hand, in Comparative Example 1, the transfer probability is low, as well as fluctuation of the transfer voltage is large. FIG. 6 is an example in which the transfer was not noticed in Comparative Example 1 and, when the second electrode was allowed to be plus, the off state was not noticed. Further, in Comparative Example 2 as shown in FIG. 7, an electric charge suppressing effect was unduly strong, an insulating state is generated and, then, the transfer to the on state was not noticed.

Figure 2:
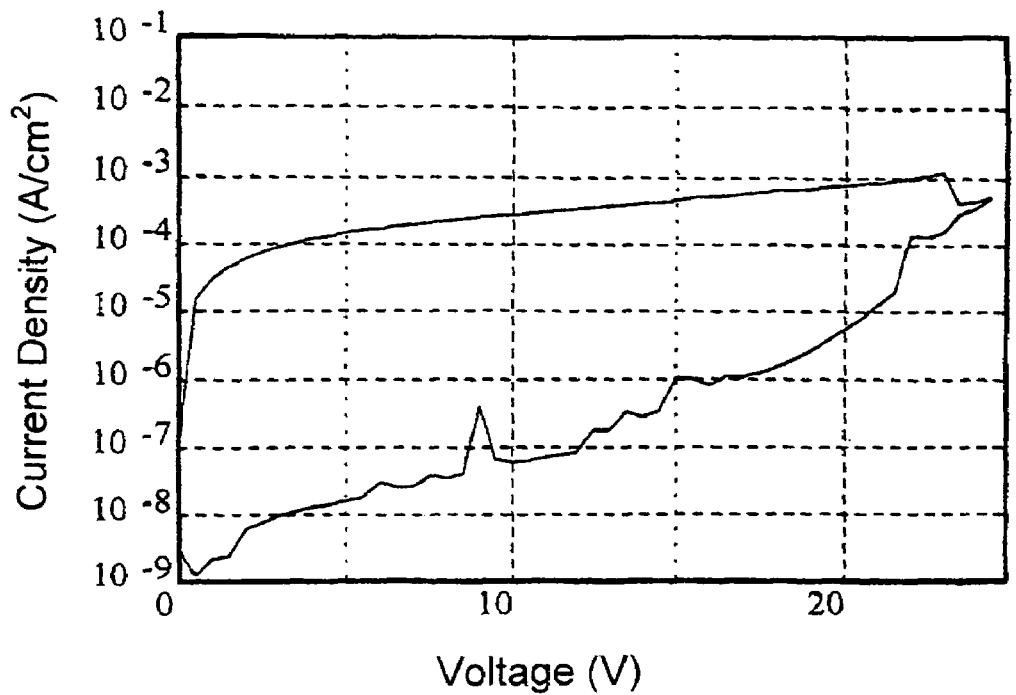
FIG. 2 is a graph showing current-voltage characteristics of the switching device according to Example 1.

Further, when a graph curve in the on state in FIG. 2, and a graph curve in FIG. 6 are compared with each other, although there is an electric charge injection suppressing layer in Example 1, the current is larger than that in Comparative Example 1 in FIG. 6. It is considered that this is due to the following reasons.

That is, it is assumed that the switching is originated by a spatial gap of interface between the organic bistable material layer 30 and the second electrode layer 20b, but it is considered that resistance of the portion thereof is extremely lowered by the switching in the on state of Example 1, and is smaller than that in a case shown in FIG. 6 in which the switching is not noticed.

EXPERIMENTAL EXAMPLE 2

Figure 8:
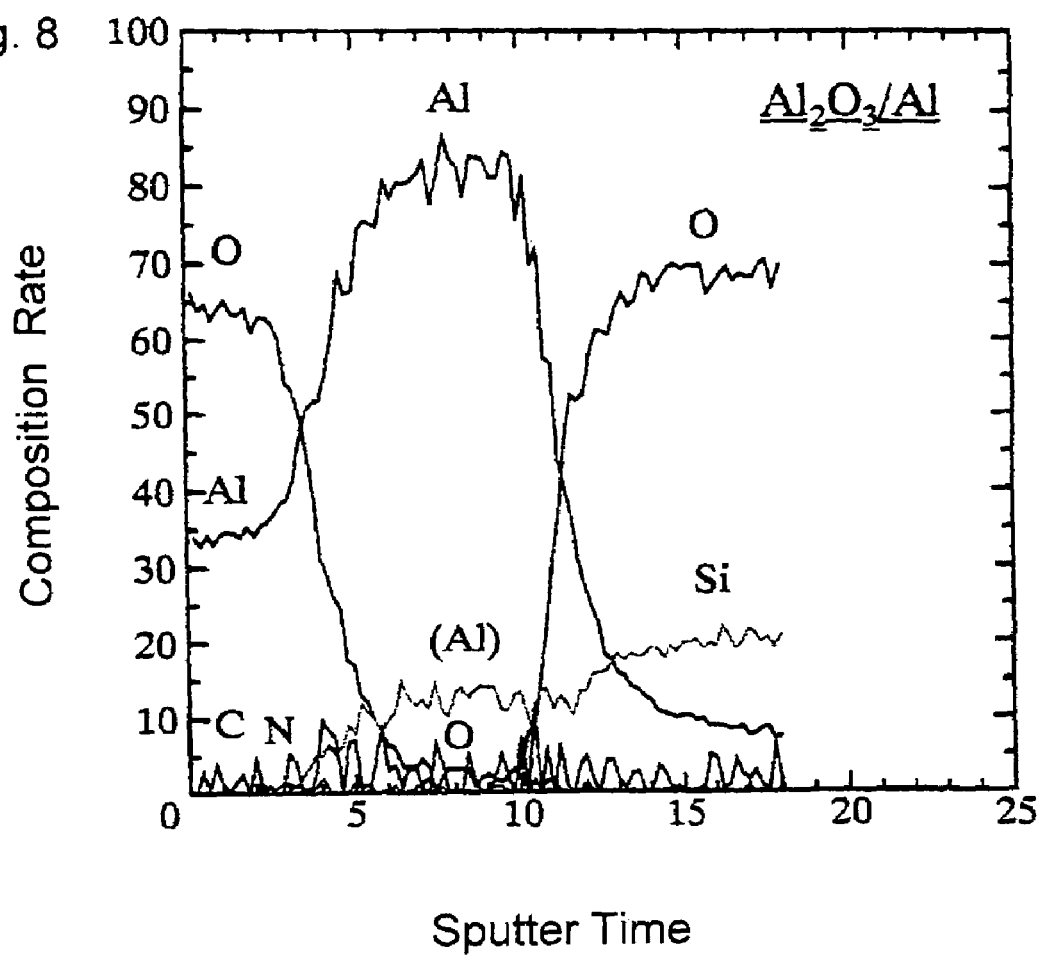
FIG. 8 is a graph showing composition analysis results by ESCA on an electric charge injection suppressing layer and a first electrode layer in the switching device according to Example 1.
Figure 9:
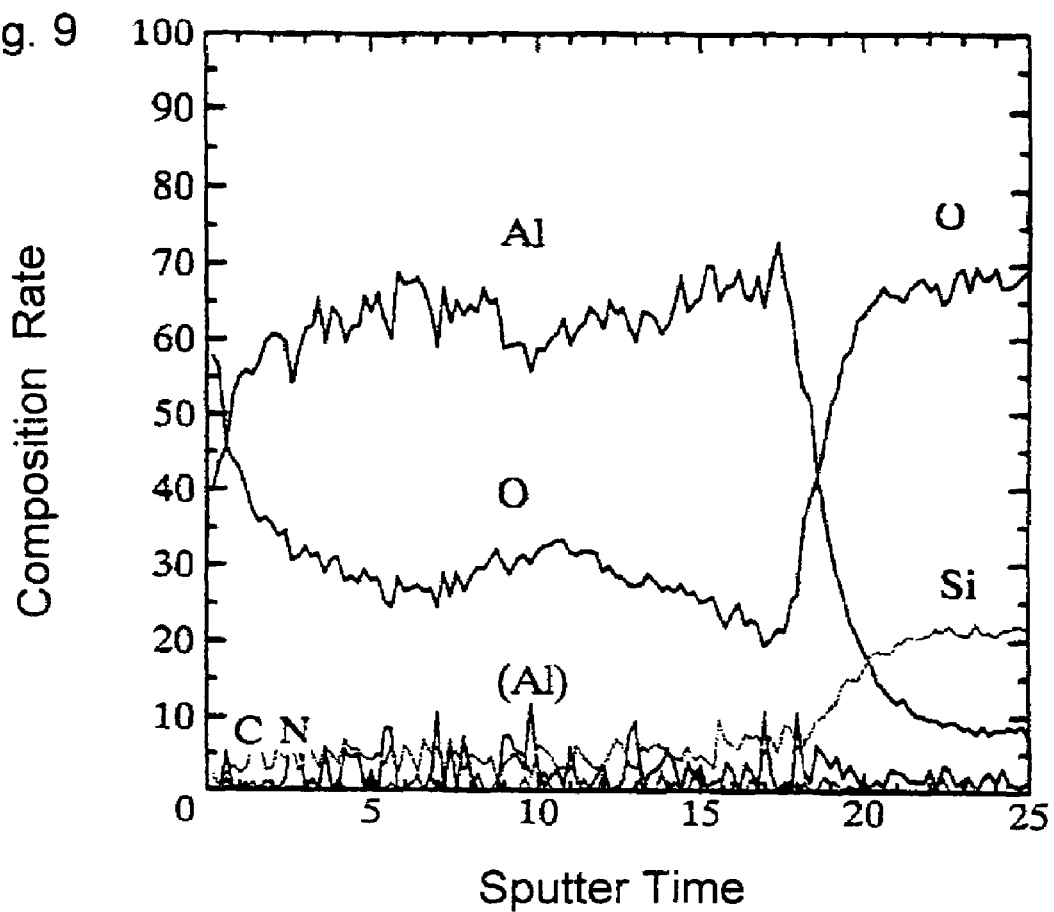
FIG. 9 is a graph showing composition analysis results by ESCA on an electric charge injection suppressing layer and a first electrode layer in the switching device according to Example 7.

With reference to switching devices in Examples 1 and 7, compositions of the electric charge injection suppressing layer 40 and the first electrode layer 20a were analyzed by using ESCA (X-ray photoelectron spectroanalyzer). The respective results are shown in FIGS. 8 and 9, respectively. Further, sputter time on abscissa axis corresponds to depth.

From FIG. 8, it was found that the electric charge injection suppressing layer in Example 1 had a composition in which $Al_2O_3$ was from 97 to 99% and Al was from 1 to 3%. From FIG. 9, it was found that, in Example 7, $Al_2O_3$ was 76% and Al was 24% in an outermost surface of 3 nm or less in depth. Further, in Example 7, although an entire aluminum electrode was oxidized to some extent, the electric resistance on such portion as oxidized is sufficiently low and, there is no practical problem therein.

The switching device according to the present invention can advantageously be used as a switching device for driving of a display panel which uses an organic EL, a liquid crystal or the like, or a high density memory or the like.

The invention has been described with reference to certain preferred embodiments thereof. It will be understood, however, that modifications and variations are possible within the scope of the appended claims.

What is claimed is:

1. A switching device, in which an organic bistable material layer containing an organic bistable compound having two types of stable resistance against an applied voltage is provided between at least two electrodes, said device comprising:
    a first electrode layer, an electric charge injection suppressing layer, an organic bistable material layer and a second electrode layer sequentially formed as respective thin films, and
    wherein the electric charge injection suppressing layer comprises an electrically conductive layer which allows an electric charge injection amount from the first electrode layer to the organic bistable material layer to be small compared with that in a case in which the electric charge is directly injected from the first electrode layer to the organic bistable material layer without providing the electric charge injection suppressing layer.

2. A switching device, in which an organic layer stable material layer containing an organic bistable compound having two types of stable resistance against an applied voltage is provided between at least two electrodes, said device comprising:
    a second electrode layer, an organic bistable material layer, an electric charge injection suppressing layer and a first electrode layer sequentially formed as respective thin films, and
    wherein the electric charge injection suppressing layer comprises an electrically conductive layer which allows an electric charge injection amount from the first electrode layer to the organic bistable material layer to be small compared with that in a case in which the electric charge is directly injected from the first electrode layer to the organic bistable material layer without providing the electric charge injection suppressing layer.

3. The switching device according to claim 1 or 2, wherein the electric charge injection suppressing layer suppresses the electric charge injection amount from the first electrode layer to the organic bistable material layer to be one tenth or less that in the case in which the electric charge is directly injected from the first electrode layer to the organic bistable material layer without providing the electric charge injection suppressing layer.

4. The switching device according to claim 1 or 2, wherein a volume resistivity of the electric charge injection suppressing layer is from $10^5$ to $10^7$ ($\Omega$cm).

5. The switching device according to claims 1 or 2 wherein the electric charge injection suppressing layer comprises a metal oxide.

6. The switching device according to claim 5, wherein the electric charge injection suppressing layer is formed by reactive deposition of a metal in an oxidative gas.

7. The switching device according to claim 5, wherein the electric charge injection suppressing layer is formed by oxidation by means of oxygen or moisture in the air.

8. The switching device according to claim 1 or 2, wherein the electric charge injection suppressing layer comprises an organic material or inorganic material having electric charge transferability.

9. The switching device according to claim 8, wherein the electric charge injection suppressing layer is formed by a counter sputter method or a sputter method using ECR plasma.

10. The switching device according to claims 1 or 2, wherein the organic bistable compound is a compound represented by the following formula (I):

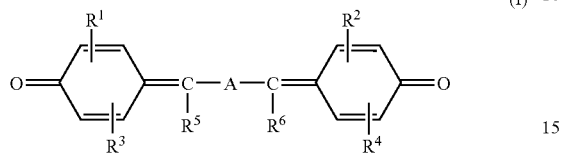
(I)

wherein $R^1$ to $R^4$ each represent a group selected from among a hydrogen atom, an alkyl group having from 1 to 6 carbon atoms which may have a substituent and an aryl group which may have a substituent, wherein $R^1$ to $R^4$ may be same with or different from one another; $R^5$ and $R^6$ each represent an aryl group which may have a substituent or a heterocyclic group which may have a substituent, wherein $R^5$ and $R^6$ are same with or different from each other; and A represents a group selected from among following groups (1) to (10):

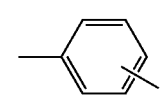
(1)

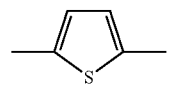
(2)

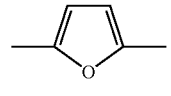
(3)

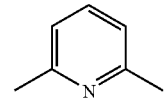
(4)

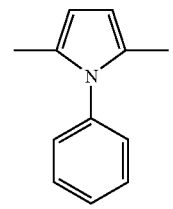
(5)

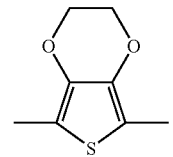
(6)

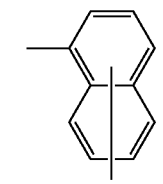
(7)

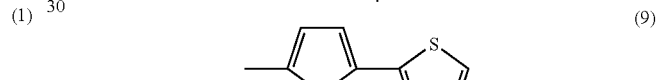
(8)

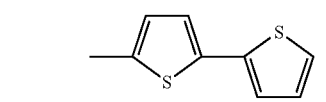
(9)

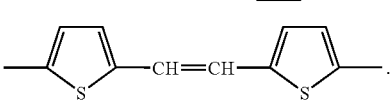
(10)

11. The switching device according to claim 10, wherein the first electrode layer comprises aluminum; and the second electrode comprises gold.

12. The switching device according to claim 1 or 2, wherein the electric charge injection suppressing layer comprises a mixture of Al and $Al_2O_3$.

* * * * *